United States Patent
Lantsman

[11] Patent Number: 5,948,215
[45] Date of Patent: *Sep. 7, 1999

[54] METHOD AND APPARATUS FOR IONIZED SPUTTERING

[75] Inventor: Alexander D. Lantsman, Middletown, N.Y.

[73] Assignee: Tokyo Electron Limited, Tokyo, Japan

[*] Notice: This patent is subject to a terminal disclaimer.

[21] Appl. No.: 08/844,757

[22] Filed: Apr. 21, 1997

[51] Int. Cl.[6] .................................................. C23C 14/34
[52] U.S. Cl. ................................ 204/192.12; 204/298.06; 204/298.08; 204/298.11; 204/298.16; 204/298.03
[58] Field of Search ..................... 204/298.06, 298.08, 204/298.11, 298.16, 192.12, 298.03; 118/723 I, 723 IR

[56] References Cited

U.S. PATENT DOCUMENTS

| | | | |
|---|---|---|---|
| Re. 34,106 | 10/1992 | Ohmi | 204/298.08 |
| 3,594,295 | 7/1971 | Meckel et al. | 204/298.08 |
| 4,464,223 | 8/1984 | Gorin | 438/729 |
| 4,844,775 | 7/1989 | Keeble | 118/723 I |
| 4,863,549 | 9/1989 | Grunwald | 156/345 |
| 4,999,096 | 3/1991 | Nihei et al. | 204/192.3 |
| 5,178,739 | 1/1993 | Barnes et al. | 204/192.12 |
| 5,401,350 | 3/1995 | Patrick et al. | 156/345 |
| 5,431,799 | 7/1995 | Mosely et al. | 204/298.06 |
| 5,449,432 | 9/1995 | Hanawa | 438/710 |
| 5,468,296 | 11/1995 | Patrick et al. | 118/723 MP |
| 5,540,800 | 7/1996 | Qian | 118/723 I |
| 5,540,824 | 7/1996 | Yin et al. | 204/298.34 |
| 5,560,776 | 10/1996 | Sugai et al. | 118/723 I |
| 5,569,363 | 10/1996 | Bayer et al. | 204/192.52 |

FOREIGN PATENT DOCUMENTS

| | | |
|---|---|---|
| 0593924A1 | 4/1994 | European Pat. Off. . |
| 0782172A2 | 7/1997 | European Pat. Off. . |
| 0801413A1 | 10/1997 | European Pat. Off. . |
| 0836218A2 | 4/1998 | European Pat. Off. . |
| 61-190070 | 8/1986 | Japan ................................ 204/298.16 |

OTHER PUBLICATIONS

Sputtering of Insulators in an RF Discharge by B. A. Probyn, Vacuum, vol. 18, No. 5, 1968.

*Primary Examiner*—Nam Nguyen
*Assistant Examiner*—Rodney G. McDonald
*Attorney, Agent, or Firm*—Wood, Herron & Evans, L.L.P.

[57] ABSTRACT

An ionized physical vapor deposition apparatus is provided with an RF coil that surrounds the space between a target and a substrate holder and is energized with RF energy, preferably in the 0.1 to 60 MHz range, to form a secondary plasma in a volume of the space between the substrate holder and the main plasma that is adjacent the target. A dielectric material, such as a quartz window, either in the wall of the chamber or inside the chamber, or insulation on the coil, protects the coil from adverse interaction with plasma. Shields between the space and the dielectric material prevent sputtered particles from forming a coating on the dielectric material. The shields are partitioned to prevent eddy currents. The shields may be biased to control contamination and may be commonly or individually biased to optimize the uniformity of coating on the substrate and the directionality of the flux of ionized material at the substrate.

23 Claims, 2 Drawing Sheets

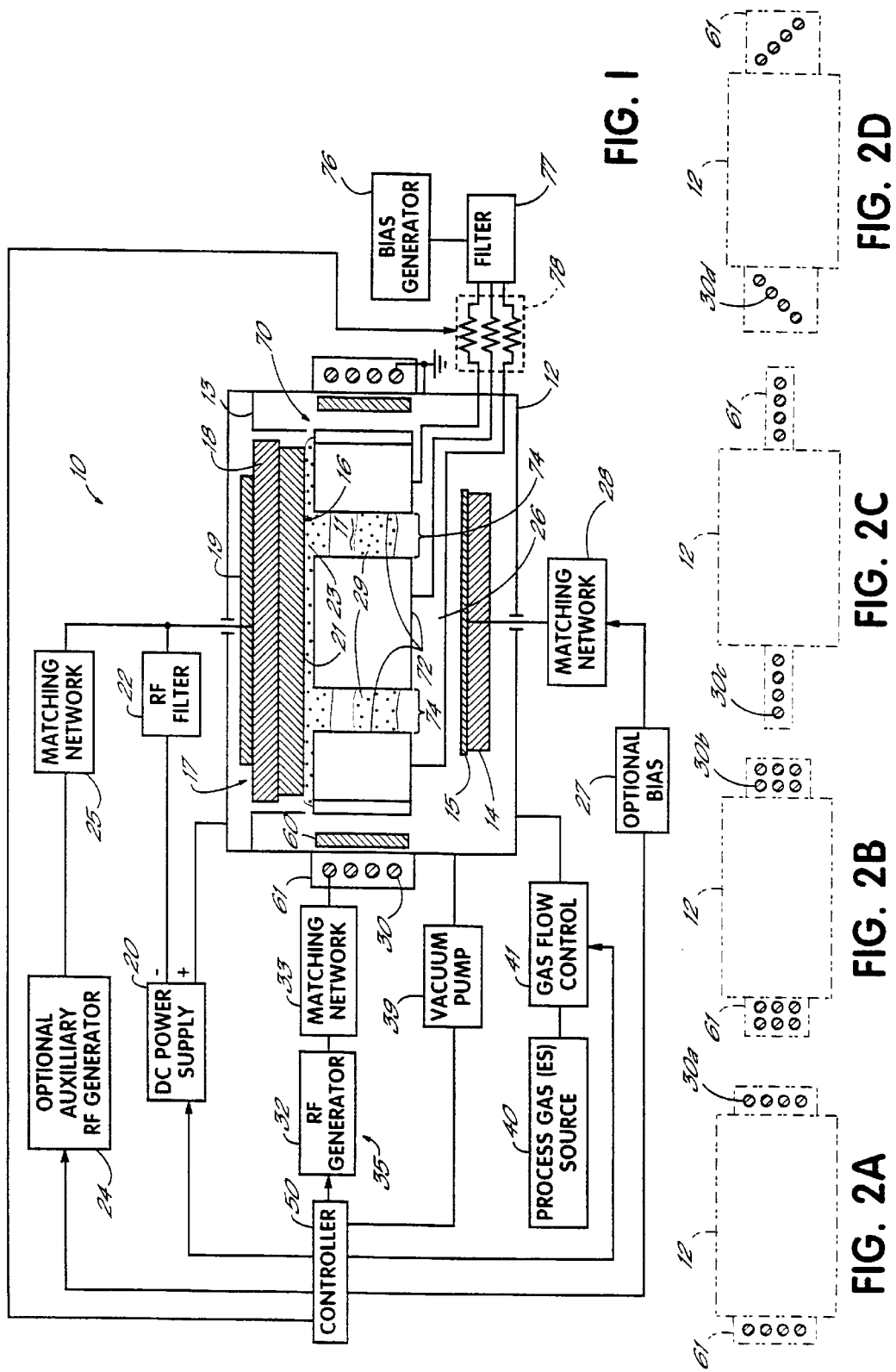

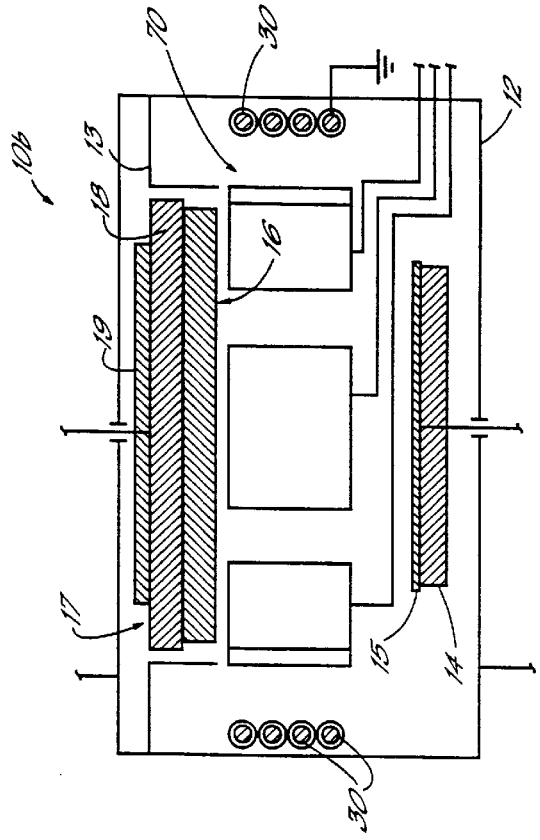
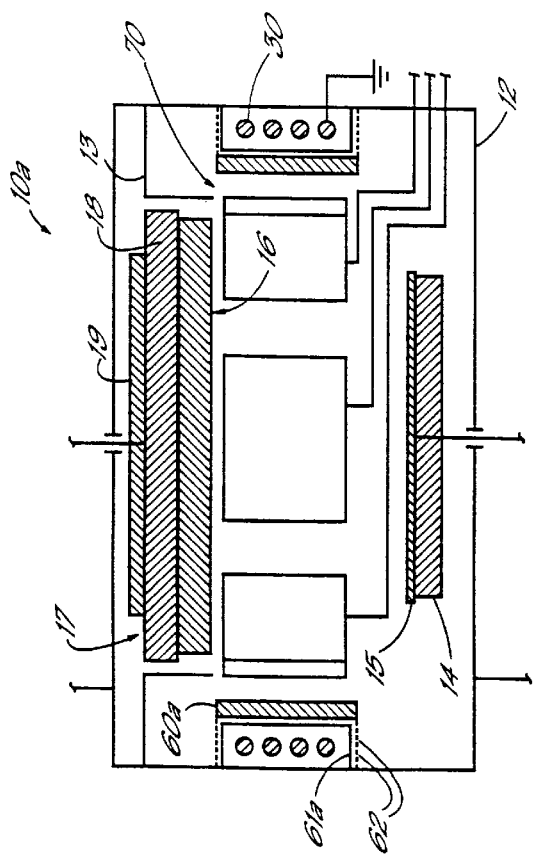
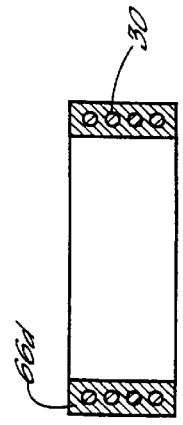
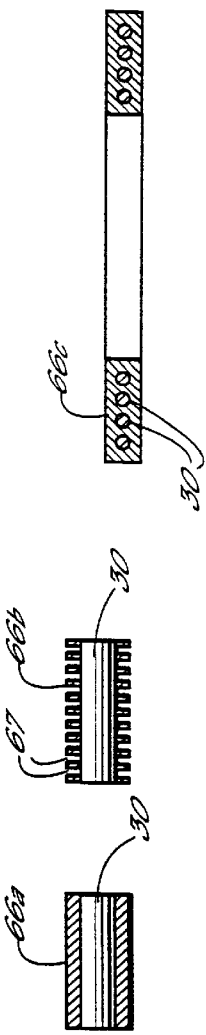
FIG. 3
FIG. 4
FIG. 5A  FIG. 5B
FIG. 5C
FIG. 5D

METHOD AND APPARATUS FOR IONIZED SPUTTERING

This invention relates to the sputter coating, and more particularly, to a method and an apparatus for conducting Ionized Physical Vapor Deposition (IPVD) onto substrates.

BACKGROUND OF THE INVENTION

The presence of sub-micron high aspect ratio features on Very Large Scale Integration (VLSI) semiconductor devices gives rise to the need to coat contacts on the bottoms of such features or to fill such features with conductive metals in the course of semiconductor device manufacture. In many semiconductor device manufacturing applications, it is required or at least preferred to apply the coatings using physical vapor deposition processes. This need or preference has resulted in a need for directing sputtered materials toward the substrate in straight lines oriented normal to the substrate surface.

For example, in semiconductor device manufacture, it is necessary to metallize contacts at the bottoms of high aspect ratio lines and vias that are in the range of 0.25 to 0.35 microns in width. Metallizing such contacts by a sputter coating processes is desirable because sputtering presents commercial advantages in time, cost and simplicity of equipment over alternative processes, particularly where devices on the substrate would sustain damage if subjected to the elevated temperatures required with coating processes such as chemical vapor deposition (CVD). With the decreasing size of features, high aspect ratios of features and the preferability of applying coatings by physical vapor deposition in certain applications, increasing demands are made on the sputtering process to achieve higher and higher degrees of directionality of the sputtered material. Unless the paths of the particles of sputtered material incident onto the substrate can be maintained highly parallel and normal to the substrate surface, the attempt to sputter coat the bottoms of the high aspect ratio holes will result in coating the tops and sides of the holes, in which event the sputter coating process does not achieve results that are satisfactory.

A sputter coating process is typically carried out by placing the substrate and a target of coating material into a vacuum chamber filled with an inert gas such as argon and creating a plasma in the gas, with the target being maintained at a negative potential, functioning as a cathode which supplies electrons to sustain the plasma. The target is typically part of a magnetron cathode assembly in which magnets behind the target trap the electrons over the surface of the target where they collide with atoms of the argon gas, stripping electrons from the atoms and converting them into positive ions. The argon ions are accelerated toward the negatively charged target where they collide with the surface and eject particles of target material. The ejected particles of target material propagate through the vacuum space where some strike and coat the substrate.

Various proposals have been made for causing the propagating particles to move in straight lines toward and normal to the substrate surface. Interposing a collimator between the target and substrate is one such method of achieving normal angles of incidence and improving incident particle directionality. Increasing the target to substrate spacing, known as long-throw sputtering, is another. Collimators provide a source of particulate contamination while both of these methods tend to substantially decrease the deposition rate.

A further method of directing sputtered material that has been given renewed consideration is the process of ionized sputtering. With ionized sputtering, often referred to as Ionized Physical Vapor Deposition or IPVD, coating material is sputtered from a target using conventional magnetron sputtering techniques, with a target energized with a negative DC or pulsed DC potential to release electrons, which produce positive ions of the gas in the chamber, which are attracted toward the target where they strike the surface and dislodge particles of the coating material. In IPVD, an additional plasma is created, such as by reactively coupling RF energy into the chamber downstream of the target, to ionize the sputtered material. A negative bias applied to the substrate attracts the positively ionized material particles, electrically accelerating them toward the substrate.

Research with IPVD has revealed that IPVD processes possess a number of drawbacks and problems that have precluded their practical use. Such processes have, for example, produced low overall efficiency. In particular, IPVD processes typically yield low deposition rates, with low ionization of the sputtered material and high film contamination. For example, with IPVD proposals of the prior art, the filling of high aspect ratio features has been found to deteriorate as sputtering power at the target increases. Such deterioration has limited the sputtering of aluminum alloys to 0.3 to 3 kW of DC power with a 12 inch magnetron target as compared to 12 to 30 kW that is typical for such target. The low sputtering power results in a low deposition rate that yields low productivity, e.g., 10 to 40 minutes of sputtering time per wafer as compared to the typical 45 seconds to 1 minute. Further, the coupling efficiency of RF energy into sputtered material has been found to be low unless operated at high pressure in the sputtering chamber, such as 30 to 40 mTorr of argon process gas as compared to sputtering pressures that are typically in the 1 to 5 mTorr range. The higher pressure results in poorer film properties and greater chamber and film contamination. Other problems that have resulted with IPVD are the sputtering of the RF electrode or element by the plasmas, the flaking of accumulated sputtered material that has deposited on the RF element, the shorting of the RF element by the plasmas or material that deposits on the element, and other plasma and material interactions with the electrode or element used to couple the RF energy into the plasma to ionize the sputtered material.

Accordingly, there is a need for an IPVD apparatus and method thereof that overcomes the drawbacks and problems of the prior art. In particular, there is a need for a practical and effective IPVD apparatus and method that produces acceptably high overall efficiency, particularly high deposition rates, high sputtered material ionization efficiency and low contamination of the deposited film.

SUMMARY OF THE INVENTION

A primary objective of the present invention is to provide an IPVD apparatus and method of high overall efficiency, particularly one that yields a high deposition rate, produces a high sputtered material ionization efficiency and that keeps deposited film contamination low. A particular objective of the present invention is to provide an apparatus and method of IPVD that will allow the sputtering power at the target to be sustained at least at a moderate level and that will provide a high RF energy coupling efficiency into sputtered material without the need to maintain the chamber at a relatively high sputtering pressure. A further objective of the present invention is to provide a method and apparatus in which adverse interaction between the plasmas in the chamber and the electrode or element used to couple the RF energy into the plasma to ionize the sputtered material is kept low, particularly the sputtering of, the flaking of sputtered material from, the potential shorting of the electrode.

According to the principles of the present invention, an IPVD apparatus and method are provided in which a main plasma is formed adjacent the target to sputter material therefrom while an RF element or electrode reactively, and preferably inductively, couples energy to a secondary plasma formed in a volume of the chamber between the main plasma and a substrate to ionize the sputtered material particles in flight toward the substrate from the target for ion-assisted deposition of the sputtered material onto the substrate. The preferred processor is provided with a configuration of protective structure that protects the RF ionization energy coupling element from adverse interaction with plasmas in the chamber, such as interaction with the main plasma as well as with the secondary RF plasma produced by the element. A shield array is provided to shield the protective structure so that the function of the protective structure is not compromised by the effects of sputtered material deposition thereon.

In the preferred embodiments of the invention, an enclosure, a dielectric window and solid or segmented element insulation is used, alone or in combination, to mutually protect the element from the plasmas and the sputtered material. The shield array is preferably in the form of a plurality of shield sections, which may be biased to control the sputtering thereof by the plasmas. The shield array has a plurality of gaps to at least partially electrically interrupt the shield sections to prevent induced eddy currents from consuming the energy and countering the coupling of energy to the plasma. Further, the individual shield sections are preferably electrically separate that may be individually biased to optimize the uniformity of coating on, and the directionality of ionized material onto, the substrate.

According to the preferred embodiments of the invention, a secondary plasma for ionizing sputtered material is created in the chamber by an inductive element or coil which couples RF energy to the sputtered material. The coil surrounds a volume of the chamber downstream of the main plasma, while protective structure separates the coil from the plasmas. In one embodiment, the coil encircles the chamber from outside the chamber behind a protective quartz window, which is in the chamber wall surrounding the processing space, with the coil covered with an external conductive enclosure. Alternatively, the coil is within the vacuum of the processing chamber outside of and downstream of the target periphery, with a protective cylindrical quartz window separating the coil from interaction with the plasmas. In a further embodiment, a coil is provided that is covered with protective insulating material, either with a solid insulator that completely covers the coil conductor or with a slotted or segmented insulator having slots sufficiently narrow to discourage the formation of plasma adjacent the conductor. The coil and protective structure are cylindrical in shape and surround the processing space.

The structure of the preferred embodiment that protects or isolates the coil from the plasma is preferably such that sputtered material that impinges upon it, if any, adheres to the structure in such a way that it does not tend to flake off of the structure to result in a source of contamination. The parts of the protective structure are further preferably configured to prevent eddy currents therein or in layers of sputtered material deposited thereon and to prevent electrostatic shielding of the RF coil.

With the present invention, sputtering power can be maintained at a high level, maintaining a high deposition rate and a high sputtered material ionization rate. The results are achieved without shorting out the RF coil and without increasing contamination and deterioration of the sputtered film. As a result, high aspect ratio features can be filled effectively and efficiently by sputtering, with high directionality of incident sputtered material normal to the substrate surface. The need of the prior art systems to reduce sputtering power is eliminated, as a dense sputtering plasma is prevented from shorting out or otherwise adversely affecting the RF plasma coupling element that creates the plasma that ionizes the sputtered material. The plasma produced by the RF element itself is prevented from shorting out the element. Sputtering gas pressure may be kept at low or normal sputtering levels, and loss of directionality due to scattering is prevented. Adverse affects from sputtering of the RF coupling element are avoided.

These and other objectives and advantages of the present invention will be more readily apparent from the following detailed description of the of the preferred embodiments of the invention, in which:

BRIEF DESCRIPTION OF THE DRAWINGS

FIG. 1 is a diagrammatic representation of a IPVD sputtering apparatus according to one embodiment of the present invention.

FIGS. 2A–2D are diagrams illustrating alternative coil configurations of the apparatus of FIG. 1.

FIG. 3 is a diagrammatic representation of an IPVD sputtering apparatus having an alternative configuration of the secondary plasma RF coupling element and protective structure in contrast to that shown in FIG. 1.

FIG. 4 is a diagrammatic representation of an IPVD sputtering apparatus having another alternative configuration of the secondary plasma RF coupling element and protective structure in contrast to those shown in FIGS. 1 and 3.

FIGS. 5A–5D are diagrammatic representations illustrating forms of coil insulating protective structure in the alternative to that shown in the embodiment of FIG. 4.

DETAILED DESCRIPTION OF THE PREFERRED EMBODIMENTS

FIG. 1 diagrammatically illustrates a sputter coating apparatus 10 according to principles of the present invention. The apparatus 10 includes a vacuum tight sputter processing chamber 12 having mounted therein a wafer support or susceptor 14 for supporting a semiconductor wafer 15 mounted thereon. A wafer 15 when mounted on the support 14 is parallel to and faces a target 16 of sputter coating material of a type that is to be deposited as a thin film on the wafer 15. A cylindrical space 11 is defined in the chamber 12 between the support 14 and the target 16. The target 16 is part of a cathode assembly 17 that includes a target holder 18, to which the target 16 is secured. A magnet pack 19 is provided behind the target holder 18 on the opposite side thereof from the support 14. A dark space shield 13 may also be provided around the periphery of the target 16. The magnet pack 19 preferably includes magnets that produce a closed magnetic tunnel that traps over the surface of the target 16 electrons given off by the cathode assembly 17 into gas within the chamber 12. The magnet pack 19 may include fixed or rotating or otherwise moving magnets, which may be permanent or electromagnets in the form of any one of a number of magnetron sputtering machines known in the art.

The apparatus 10 includes a power supply or source of DC power 20, which may be switched on to remain constant or may be pulsed. The power supply is preferably connected to the cathode assembly 17 through an RF filter 22. An auxiliary source of energy such as an RF generator 24 may also be optionally connected to the cathode assembly 17, which would be connected through a matching network 25. A bias circuit 27 is provided and connected to the substrate holder 14 through a matching network 28 to apply a bias to a wafer 15 mounted thereon. The power from the DC power supply 20 and/or RF generator 24 produces a negative potential on the surface 21 which causes electrons to be emitted from surface 21 of the target 16 which remain trapped over the surface 21 by the magnetic field generated by the magnet pack 19 until they strike and ionize atoms of process gas in close proximity to the surface 21 of the target 16, forming a main plasma 23 adjacent to the target surface 21. This main plasma 23 becomes a source of positive ions of gas that are accelerated toward and against the surface 21 to eject particles of coating material from the target 16.

The space 11 between the target surface 21 and the substrate 15 on the support 14 can be considered as formed of two parts. One part is that occupied by the main plasma 23 while the second part of the space 11 is a volume 26 that lies between the plasma 23 and the substrate 15 and support 14. The particles of sputtered material from the target 16 generally originate as neutral in charge and propagate by momentum only through the space 11, where some, but not all, pass through the plasma 23 and the volume 26 to impinge upon the substrate 15. For coating contacts at the bottoms of high aspect ratio holes and other features and for metallizing the holes by filling them with sputtered conductive material, it is highly preferred in VLSI semiconductor device manufacturing that the particles impinge onto the substrate surface in straight lines normal to the substrate, so they can proceed directly to the bottoms of the features. This desired impingement of particles upon the substrate is facilitated in the apparatus 10 by ionizing the sputtered coating particles as they pass through the volume 26 and then electrostatically accelerating the ionized coating particles toward the substrate. Such a process is known in the art as ionized physical vapor deposition (IPVD) or ion-assisted sputter coating.

According to certain principles of the present invention, in-flight ionization of sputtered particles in the space 26 is carried out by reactively and preferably inductively coupling RF energy into the volume 26 by provision of an element that surrounds the volume 26 but does not occupy the space 11. The element is preferably in the form of a coil assembly 30 in the form of, for example, any of the configurations 30a–30d illustrated in FIGS. 2A–2D. The configurations of the coil assembly 30 should include coils, windings and/or coil and winding arrangements such that energy inductively coupled to the gas in the volume 26 energizes a secondary plasma 29 in the volume 26 that is distinct from the main plasma 23.

An RF generator 32, preferably operative in the range of from 0.1 to 60 MHz, is connected to the coil assembly 30 through a matching network 33.

A source of processing gas 40 is connected to the chamber 11, through a flow control device 41. For sputter processing, the gas from the supply 40 is typically an inert gas such as argon. A high vacuum pump 39 is also connected to the chamber 12 to pump the chamber to a vacuum level in the milliTorr or sub-milliTorr range.

Between the coil assembly 30 and the space 11 there is provided protective structure that prevents the plasmas 23 and 29 from contacting and electrically interacting with the coil assembly 30. This structure is an electrically non-conductive material that does not impede the magnetic field surrounding the coil assembly 30 from reaching into the volume 26. One preferred form of protective structure is that of a window 60, made of vacuum compatible dielectric material such as quartz, in the wall of the chamber 12, that is mounted to form a vacuum tight seal with the chamber wall. The window may be a single piece of insulating magnetically-transparent material or may be formed in joined segments thereof, to form a generally cylindrical protective structure. The coil 30, in this embodiment, is in the form of a coil wound around the chamber 12 outside the window 60. Covering the coil assembly 30 on the outside thereof is a conductive metal cover 61, which prevents electromagnetic energy radiating from the coil 30 and from within the chamber 12 to radiate outside of the chamber 12.

The window 60, while initially not electrically conductive, is kept from accumulating an electrically conductive film of sputtered material. Electrical conductivity in or on the window 60 supports the induction of eddy currents and contributes to electrostatic shielding of the coil 30, rendering it less effective. Such conductivity, particularly in a circumferential direction or direction which extends wholly or substantially around the chamber 12 will effectively electronically short out or negate the inductive coupling of energy into the volume 26 to form the plasma 29. To prevent such buildup of conductive sputtered material on the window 60 or alternative protective structure, a shield array 70 is provided between the space 11 and the window 60. The shield array 70 at least partially shadows the window 60 from material sputtered from the target 16, but has sufficient spaces or gaps 74 therein to facilitate the coupling of energy from the coil 30 into the volume 26.

The shield array 70 is preferably a plurality of individual shields or shield segments 72 that shadow at least axial strips of the window 60 so that circumferential conductive paths are not formed by a coating of sputtered material. The gaps 74 are configured to substantially interrupt circumferential current paths in the shield array 70 and are configured to extend entirely or partially across the axial dimension of the array 70. The shield segments 72 should be made of a metal or other material selected to retain sputtered material coating thereon when such coating forms on the shield segments 72. Otherwise, such deposits will flake off and cause contamination of the chamber 12 and of wafers 15 being processed. In order to control the buildup of deposited material on the shields 72 and thereby reduce the risk of contamination, the shield segments 72 may be electrically biased. The segments 72 are also preferably individually biased with their biases separately controllable for use in optimizing the distribution of film being deposited on the substrate, such as by optimizing the uniformity of coating on, and the directionality of ionized material onto, the substrate 15. In such a configuration, the gaps 74 will completely separate and electrically isolate each of the separately biased shield segments 72 from each other. The bias is provided by a generator 76 that is connected through a filter or matching network 77, with each shield separately connected through a current limiting resistor 78. The resistors 78 may be variable or other means may be provided for individually controlling the bias of the shield segments 72.

The apparatus 10 also includes a main controller 50 that is preferably a microprocessor-based programmable controller operative to sequence and control the operation of the components discussed above. The controller 50 has outputs for controlling the energization of the cathode power supplies 20 and 24, the substrate bias power supply 27, the RF generator 32 for energizing the coil assembly 30 or other secondary plasma generating element, the gas flow control 41, the pump 39, the current limiting resistors 78, and other controllable components of the apparatus 10.

FIG. 3 illustrates an alternative embodiment 10a to the apparatus 10, in which a coil 30 is situated in the vacuum chamber 12, inside the wall of the chamber 12 but still outside of the space 11. The protective structure is in the form of a window 60a that is situated between the coil 30 and the space 11, on an enclosure 61a that extends inwardly from the inside of the wall of the chamber 12 and encloses the coil 30. The enclosure 61a contains ports 62 that vent the inside of the enclosure in which the coil 30 lies to the vacuum of the chamber 12. The shield array 70 is situated as in the embodiment above to shadow the window 60a from the target 16.

In lieu of a window 60 or 60a, alternative embodiment 10b of FIG. 4 utilizes protective structure in the form of an insulative coating 66 to cover the conductor of the coil 30. In this embodiment, the coil 30 is situated in the chamber 12 outside of the space 11, surrounding the volume 26. The shield array 70 is situated as in the embodiments above to shadow the insulating layer 66 from the target 16. The insulator 66 may be in any one of a number of forms, such as that of a solid insulator 66a that totally covers the surface of the conductor of the coil 30, as illustrated in FIG. 5A, or may be in the form of a plurality of discrete insulator segments 66b, as illustrated in FIG. 5B. With the segmented insulator 66b, gaps 67 between the segments facilitate the effectiveness of the coil 30 while the narrowness of the gaps 67 is preferably maintained to less than the mean free path of the gas molecules in the chamber 12 so that it will not communicate plasma to the conductor of the coil 30. In lieu of an insulative coating on the coil 30, insulating material may encase the coil 30, such as insulators 66c and 66d of FIGS. 5C and 5D, respectively. These and a number of other alternative protective structures for isolating the coil 30 from the plasmas are useable.

Those skilled in the art will appreciate that the applications of the present invention herein are varied, and that the invention is described in preferred embodiments Accordingly, additions and modifications can be made without departing from the principles of the invention.

What is claimed is:

1. An ionized physical deposition method comprising the steps of:
   creating, with a main energy source, a main plasma in a vacuum chamber and sputtering a target therewith to produce particles of coating material in a space between the target and a substrate to be coated;
   with a coil surrounding the space and through a dielectric material interposed between the coil and the space, inductively coupling RF energy from the coil through the dielectric material and into a volume of the space between the substrate and the main plasma to energize with the coupled RF energy a secondary plasma in the volume and ionizing particles of the coating material in the volume with the secondary plasma;
   while the main plasma creating step is being performed and with a shield spaced from the dielectric material and positioned between the space and the dielectric material, physically shielding the dielectric material from particles of coating material without electrically shielding the volume from the RF energy; and
   electrically directing ionized particles of coating material from the volume onto the substrate.

2. The method of claim 1 further comprising the step of:
   biasing the shield to control substrate contamination from a film forming on the shield.

3. The method of claim 1 further comprising the step of:
   biasing the shield to control the distribution of a film being deposited on the substrate.

4. The method of claim 3 wherein:
   the biasing step includes the step of individually and selectively biasing a plurality of electrically distinct sections of the shield to control the distribution of film being deposited on the substrate.

5. The method of claim 1 wherein:
   the coupling step is performed through a dielectric window in a wall of the vacuum chamber.

6. The method of claim 1 wherein:
   the coupling step is performed with the coil positioned outside of the chamber and through a dielectric window in a wall of the vacuum chamber.

7. The method of claim 1 wherein:
   the coupling step is performed with the coil positioned inside the chamber and through a dielectric window inside the chamber.

8. The method of claim 1 wherein:
   the coupling step is performed with the coil inside of the chamber having the dielectric material coating the coil.

9. An ionized physical vapor deposition apparatus comprising:
   a vacuum sputtering chamber;
   a sputtering target in the chamber having a sputtering surface thereon;
   a cathode power supply connected to the target to energize the target to produce a main plasma in proximity to the sputtering surface;
   a substrate support in the chamber spaced from the target, oriented to support a substrate thereon facing the target and parallel thereto, and defining a space between the target and the substrate holder;
   a coil surrounding a volume of the chamber between the main plasma and the substrate holder;
   an RF energy source connected to the coil to energize the coil to inductively couple RF energy into the volume to form a secondary plasma to ionize in-flight sputtered material passing through the volume;
   means for electrically directing ions of the sputtered material in a direction normal to the substrate;
   electrically non-conductive protective structure interposed between the coil and the space to isolate the coil from plasma in the space; and
   a shield disposed circumferentially around and outside of the space, inside the vacuum chamber and spaced inwardly from the electrically non-conductive protective structure between the target and the electrically non-conductive protective structure so as to physically shield the electrically non-conductive protective structure from sputtered material, the shield having at least one axially extending gap at least partially electrically separating the shield sufficiently to circumferential currents in the shield.

10. The apparatus of claim 9 wherein:
    the shield includes an array of a plurality of distinct shield segments spaced by gaps which electrically separate the segments.

11. The apparatus of claim 9 wherein:
    the electrically non-conductive protective structure includes a dielectric window in a wall of the chamber, the coil being located behind the window outside of the chamber.

12. The apparatus of claim 9 wherein:

the coil is positioned inside of the chamber; and the electrically non-conductive protective structure includes a dielectric window inside the chamber between the coil and the space.

13. The apparatus of claim 9 wherein:

the coil is positioned inside the chamber; and the electrically non-conductive protective structure includes an insulation layer on the coil.

14. The apparatus of claim 13 wherein:

the insulation layer completely covers the coil.

15. The apparatus of claim 13 wherein:

the insulation layer includes a plurality of discrete insulation segments separated by gaps having insufficient widths to support penetration of plasma through the gaps to the coil.

16. The apparatus of claim 9 wherein:

the RF energy source is operative to energize the coil at a frequency of between 0.1 MHz and 60 MHz.

17. The apparatus of claim 9 further comprising:

means for electrically biasing the shield.

18. The apparatus of claim 9 wherein:

the shield includes an array of a plurality of distinct shield segments spaced by gaps electrically separating the segments; and the apparatus further comprises means for electrically biasing the shield segments of the array.

19. An ionized physical deposition method comprising the steps of:

producing a main plasma in a vacuum chamber with a main energy source;

sputtering a target of electrically conductive coating material with the main plasma in the vacuum chamber and producing thereby sputtered particles of electrically conductive coating material in a space between the target and a substrate to be coated which is supported in the chamber;

inductively coupling RF energy from a coil surrounding the space through a dielectric window between the coil and the space and forming with the coupled RF energy a secondary plasma in a volume of the space that lies between the substrate and the target;

ionizing sputtered particles of the coating material in the volume with the secondary plasma;

physically shielding the dielectric window from the sputtered particles of electrically conductive coating material with a shield, in the vacuum chamber and spaced inwardly from the window, such that, if the shield is coated with the electrically conductive coating material it allows passage of RF energy from the coil into the volume; and directing ionized particles of the coating material from the volume toward the substrate.

20. The method of claim 19 wherein:

the ionized particle directing step includes the step of electrically biasing the substrate and thereby electrostatically attracting ionized particles of coating material toward the substrate.

21. The method of claim 19 wherein:

the shielding step is performed with a shield that provides no circumferential current path around the space.

22. The apparatus of claim 9 wherein:

the means for directing ions of sputtered material includes a bias energy generator connected to the substrate support to electrically bias a substrate on the support to accelerate ions of the sputtered material in a direction normal to the substrate.

23. The method of claim 1 wherein:

the ionized particle electrically directing step includes the step of biasing the substrate to attract ionized particles of coating material from the volume onto the substrate.

* * * * *

UNITED STATES PATENT AND TRADEMARK OFFICE
CERTIFICATE OF CORRECTION

PATENT NO. : 5,948,215

DATED : September 7, 1999

INVENTOR(S) : Lantsman

It is certified that error appears in the above-identified patent and that said Letters Patent is hereby corrected as shown below:

Column 1, line 21 reads "by a sputter coating processes is" and should read --by a sputter coating process is--.

Column 1, line 36 reads "the tops and sides" and should read -- the sides --.

Column 9, line 32 reads "to circumferential" and should read -- to reduce circumferential--.

Signed and Sealed this

Third Day of April, 2001

*Attest:*

NICHOLAS P. GODICI

*Attesting Officer*     *Acting Director of the United States Patent and Trademark Office*